US010297651B2

(12) United States Patent
Zhai et al.

(10) Patent No.: US 10,297,651 B2
(45) Date of Patent: May 21, 2019

(54) DRIVE CIRCUIT AND ORGANIC LIGHT-EMITTING DIODE DISPLAY EACH HAVING SWITCHING TRANSISTOR WITHOUT ETCH STOPPING LAYER ON OXIDE SEMICONDUCTOR

(71) Applicants: Shanghai Tianma Micro-Electronics Co., Ltd., Shanghai (CN); Tianma Micro-Electronics Co., Ltd., Shenzhen (CN)

(72) Inventors: Yingteng Zhai, Shanghai (CN); Yong Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/829,390

(22) Filed: Aug. 18, 2015

(65) Prior Publication Data
US 2016/0071912 A1    Mar. 10, 2016

(30) Foreign Application Priority Data
Sep. 4, 2014   (CN) .......................... 2014 1 0448559

(51) Int. Cl.
    H01L 27/32      (2006.01)
    H01L 27/12      (2006.01)
(52) U.S. Cl.
    CPC ...... *H01L 27/3258* (2013.01); *H01L 27/1214* (2013.01); *H01L 27/1225* (2013.01);
    (Continued)

(58) Field of Classification Search
    CPC ............. H01L 27/1214; H01L 27/1225; H01L 27/1251; H01L 27/3244; H01L 27/3258; H01L 27/3262
    See application file for complete search history.

(56) References Cited

U.S. PATENT DOCUMENTS

| 2009/0121982 A1 | 5/2009 | Choi |
| 2011/0024751 A1* | 2/2011 | Yamazaki ........... H01L 27/1225 257/57 |

(Continued)

FOREIGN PATENT DOCUMENTS

| CN | 101212851 A | 7/2008 |
| CN | 102683276 A | 9/2012 |
| CN | 102820317 A | 12/2012 |

OTHER PUBLICATIONS

Chinese Application No. 201410448559.0, First Office Action dated Aug. 31, 2016.

*Primary Examiner* — Michael Jung
(74) *Attorney, Agent, or Firm* — Alston & Bird LLP

(57) ABSTRACT

A drive circuit, an organic light-emitting diode display, and methods for fabricating the same are provided. The drive circuit includes: a driving transistor, including a first gate, a first semiconductor layer disposed above the first gate, an etch stopping layer disposed on the first semiconductor layer, and a first source and a first drain which are disposed on the two sides of the first semiconductor layer, the first semiconductor layer being made of oxide semiconductor material; and a switching transistor, including a second gate, a second semiconductor layer disposed above the second gate, and a second source and a second drain which are disposed on two sides of the second semiconductor layer, the second semiconductor layer being made of oxide semiconductor material. In the drive circuit, reliability and unifor- (Continued)

mity of the drive transistors are improved, and parasitic capacitance of the switching transistor decreases.

6 Claims, 7 Drawing Sheets

(52) U.S. Cl.
CPC ...... *H01L 27/1251* (2013.01); *H01L 27/1288* (2013.01); *H01L 27/3244* (2013.01); *H01L 27/3262* (2013.01)

(56) References Cited

U.S. PATENT DOCUMENTS

| | | | |
|---|---|---|---|
| 2011/0163310 A1* | 7/2011 | Park | H01L 29/78606 257/43 |
| 2012/0146017 A1* | 6/2012 | Kim | H01L 29/7869 257/43 |
| 2012/0292645 A1 | 11/2012 | Park | |
| 2012/0305910 A1* | 12/2012 | Hsieh | H01L 27/1222 257/43 |
| 2013/0240914 A1* | 9/2013 | Jin | H01L 27/3246 257/88 |
| 2014/0103343 A1 | 4/2014 | Jiang | |

* cited by examiner

US 10,297,651 B2

DRIVE CIRCUIT AND ORGANIC LIGHT-EMITTING DIODE DISPLAY EACH HAVING SWITCHING TRANSISTOR WITHOUT ETCH STOPPING LAYER ON OXIDE SEMICONDUCTOR

CROSS REFERENCE OF RELATED APPLICATION

The present application claims the priority to Chinese Patent Application No. 201410448559.0, entitled "DRIVE CIRCUIT, ORGANIC LIGHT-EMITTING DIODE DISPLAY, AND METHOD FOR FABRICATING THE SAME", filed on Sep. 4, 2014 with the State Intellectual Property Office of People's Republic of China, which is incorporated herein by reference in its entirety.

FIELD

The disclosure relates to photoelectric display technologies, and in particular, to a drive circuit, an organic light-emitting diode display, and methods for fabricating the same.

BACKGROUND OF THE INVENTION

With advantages such as light weight, thin size, vivid colors, wide angle of view, and high contrast, an organic light-emitting diode (OLED) display gradually becomes one of the rapidest developing panel displays. The OLED display displays images by using organic light-emitting materials, and changes brightness based on the intensity of an applied current (or voltage) to implement the displaying of various greyscales.

The OLED display includes pixel units and drive circuits for driving the pixel units. Each drive circuit normally includes a data line, a power line, a gate line, at least one switching transistor and at least one driving transistor, etc.

However, a conventional drive circuit has poor performance, thereby causing poor performance of a conventional OLED display.

SUMMARY OF THE INVENTION

One inventive aspect of this disclosure is a drive circuit. The drive circuit includes: a driving transistor, including a first gate, a first semiconductor layer disposed above the first gate, an etch stopping layer disposed on the first semiconductor layer, and a first source and a first drain which are disposed above the etch stopping layer, the first semiconductor layer being made of an oxide semiconductor material; and a switching transistor, including a second gate, a second semiconductor layer disposed above the second gate, and a second source and a second drain which are disposed on the second semiconductor layer, the second semiconductor layer being made of an oxide semiconductor material.

In another aspect of the disclosure, an OLED display is further provided. The OLED display includes: a substrate, an OLED disposed on the substrate, and the foregoing drive circuit, the drive circuit being disposed on the substrate.

In further another aspect of the disclosure, a method for fabricating a drive circuit is provided. The method includes: providing a substrate; forming a first gate and a second gate on the substrate; forming a gate dielectric layer to cover the first gate and the second gate; forming a first semiconductor layer on the gate dielectric layer, where the first semiconductor layer corresponds to the first gate and is made of an oxide semiconductor material; forming a second semiconductor layer on the gate dielectric layer, where the second semiconductor layer corresponds to the second gate and is made of an oxide semiconductor material; forming an etch stopping layer on the first semiconductor layer; after the etch stopping layer is formed, forming a first source and a first drain respectively on two sides of the first semiconductor layer to form a driving transistor, and forming a second source and a second drain respectively on two sides of the second semiconductor layer to form a switching transistor; and forming a dielectric layer to cover the driving transistor and the switching transistor.

In still another aspect of the disclosure, a method for fabricating an OLED display is provided, where a drive circuit in the OLED display is formed by using the foregoing method for fabricating the drive circuit.

BRIEF DESCRIPTION OF THE DRAWING(S)

FIG. 1 schematically shows a driving transistor and a switching transistor in a first conventional drive circuit;

FIG. 2 schematically shows a driving transistor and a switching transistor in a second conventional drive circuit;

FIG. 3 schematically shows a driving transistor and a switching transistor in a drive circuit according to a first embodiment of the disclosure;

FIG. 4 schematically shows a driving transistor and a switching transistor in a drive circuit according to a second embodiment of the disclosure;

DETAILED DESCRIPTION OF THE INVENTION

Figure 1:
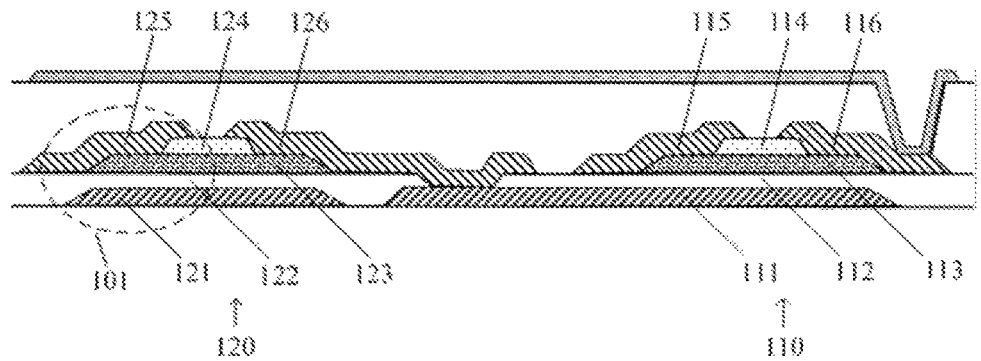
Figure 2:
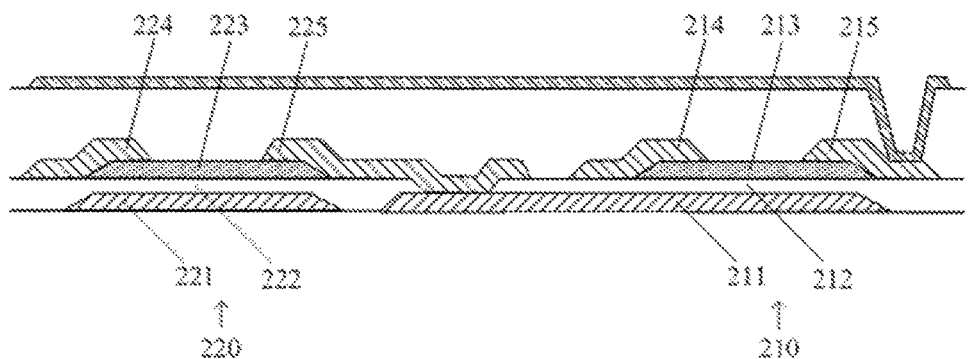

As described in background, a conventional drive circuit has poor performance. FIG. 1 and FIG. 2 show two different conventional drive circuits.

As shown in FIG. 1, a first conventional drive circuit includes a driving transistor 110. The driving transistor 110 includes a first gate 111, a first semiconductor layer 113 disposed above the first gate 111, a first dielectric layer 112 disposed between the first gate 111 and the first semiconductor layer 113, a first etch stopping layer 114 disposed above the first semiconductor layer 113, and a first source 115 and a first drain 116 which are disposed on two sides of the first semiconductor layer 113.

As shown in FIG. 1, the first conventional drive circuit further includes a switching transistor 120. The switching transistor 120 includes a second gate 121, a second semiconductor layer 123 disposed above the second gate 121, a second dielectric layer 122 disposed between the second gate 121 and the second semiconductor layer 123, a second etch stopping layer 124 disposed above the second semiconductor layer 123, and a second source 125 and a second drain 126 which are disposed on two sides of the second semiconductor layer 123.

In the first conventional drive circuit shown in FIG. 1, the switching transistor 120 has the second etch stopping layer 124; and due to existence of the second etch stopping layer 124, the second source 125 should partially cover the second etch stopping layer 124 when being disposed onto the second semiconductor layer 123. Hence, an overlapping area of the second source 125 and the second gate 121 increases, thereby causing an increased parasitic capacitance between the second source 125 and the second gate 121. The overlapping area is shown as an area defined by a dotted line circle 101. With a large parasitic capacitance, loads of peripheral circuits around the switching transistor 120 may increase, and compensation effect of the drive circuit may be weakened.

As shown in FIG. 2, a second conventional drive circuit includes a driving transistor 210. The driving transistor 210 includes a first gate 211, a first semiconductor layer 213 disposed above the first gate 211, a first dielectric layer 212 disposed between the first gate 211 and the first semiconductor layer 213, and a first source 214 and a first drain 215 which are disposed on two sides of the first semiconductor layer 213.

As shown in FIG. 2, the second conventional drive circuit further includes a switching transistor 220. The switching transistor 220 includes a second gate 221, a second semiconductor layer 223 disposed above the second gate 221, a second dielectric layer 222 disposed between the second gate 221 and the second semiconductor layer 223, and a second source 224 and a second drain 225 which are disposed on two sides of the second semiconductor layer 223.

In the second conventional drive circuit shown in FIG. 2, the driving transistor 210 does not have an etch stopping layer. Although the driving transistor 210 without the etch stopping layer may have a small parasitic capacitance, the first semiconductor layer 213 for forming a channel region is prone to damage during the process of forming the driving transistor 210 due to absence of the etch stopping layer (i.e., a manufacturing process of the driving transistor 210 is apt to cause damage to the channel). Once the channel is damaged, reliability of single driving transistor decreases; furthermore, uniformity of driving transistors is poor because of different damage severities of different driving transistors, and therefore, Mura phenomenon is apt to occur on a corresponding display.

In view of the above, a new drive circuit is provided in the disclosure. A driving transistor of the drive circuit includes an etch stopping layer which may protect the channel (i.e., protect the first semiconductor layer); hence the channel of each driving transistor may not be damaged in forming the each transistor, reliability and uniformity of the driving transistors are improved, and thanks to the improved uniformity of the driving transistors, the Mura phenomenon is avoided from occurring on the corresponding display. Since a switching transistor of the drive circuit does not include an etch stopping layer, parasitic capacitance of the switching transistor decreases, thereby reducing loads of peripheral circuits around the switching transistor, saving power consumption, and improving compensation effect of the drive circuit.

A method for fabricating the drive circuit, an OLED display having the drive circuit and a method for fabricating the OLED display are correspondingly provided in the disclosure.

To make features and merits of the disclosure more apparent and understandable, embodiments of the disclosure are described in detail in the following in conjunction with drawings.

A drive circuit is provided according to a first embodiment of the disclosure.

Figure 3:
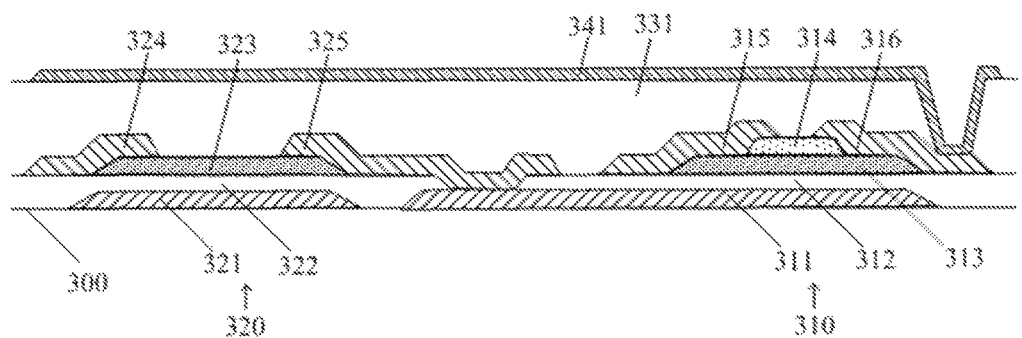

As shown in FIG. 3, the drive circuit includes a driving transistor 310. The driving transistor 310 includes a first gate 311, a first semiconductor layer 313 disposed above the first gate 311, a first dielectric layer 312 disposed between the first gate 311 and the first semiconductor layer 313, an etch stopping layer 314 disposed above the first semiconductor layer 313, and a first source 315 and a first drain 316 which are disposed on two sides of the first semiconductor layer 313. According to other embodiments, positions of the first source and the first drain are interchangeable.

As shown in FIG. 3, the drive circuit further includes a switching transistor 320. The switching transistor 320 includes a second gate 321, a second semiconductor layer 323 disposed above the second gate 321, a second dielectric layer 322 disposed between the second gate 321 and the second semiconductor layer 323, and a second source 324 and a second drain 325 which are disposed on two sides of the first semiconductor layer 323. According to other embodiments, positions of the second source and the second drain are interchangeable. The second drain 325 is electrically connected to the first gate 311.

It should be illustrated that, in the drive circuit provided in the disclosure, driving transistors are transistors for controlling output current intensities, and other transistors except the driving transistors are switching transistors.

According to the embodiment, the first semiconductor layer 313 and the second semiconductor layer 323 are made of an oxide semiconductor material. The oxide semiconductor material is a compound semiconductor material formed by metal and oxygen, e.g., the oxide semiconductor material may be one or any combination of InGaZnO, InAlZnO, InSnZnO, ZnO, CdO, TiO2, Al2O3, SnO, Cu2O, NiO, CoO, FeO and Cr2O3.

According to the embodiment, the first gate 311 and the second gate 321 may be made of metal or alloy, such as aluminum, copper, aluminum-niobium alloy, or molybdenum-tungsten alloy. The first gate 311 and the second gate 321 may be made of a same material; hence, the first gate 311 and the second gate 321 may be formed at a same time through a same process, thereby simplifying processes and saving the cost. In other embodiments of the disclosure, the first gate and the second gate may be made of different materials.

According to the embodiment, the first dielectric layer 312 and the second dielectric layer 322 may be made of silicon oxide, silicon nitride or other material that has proper insulation properties. The first dielectric layer 312 and the second dielectric layer 322 respectively serve as a gate dielectric layer of the driving transistor 310 and a gate dielectric layer of the switching transistor 320.

According to the embodiment, both the driving transistor 310 and the switching transistor 320 are disposed on a substrate. In FIG. 3, although the substrate is not completely shown, a straight line 300 at the bottom represents a surface of the substrate.

According to the embodiment, the second drain 325 of the switching transistor 320 is electrically connected to the first gate 311; hence, the switching transistor 320 is electrically connected to the driving transistor 310.

According to the embodiment, the driving transistor 310 and the switching transistor 320 are both covered by a dielectric layer 331. The dielectric layer 331 includes an opening through which the first drain 316 is exposed, and an electrode layer 341 is electrically connected to the first drain 316 through the opening.

According to the embodiment, the etch stopping layer 314 may be made of a metallic oxide including at least one of alumina oxide, titanium oxide and yttrium oxide. Alternatively, the etch stopping layer 314 may be made of a nonmetallic compound including at least one of silicon oxide, silicon nitride and silicon oxynitride. Alternatively, the etch stopping layer 314 may be made of a combination of the metallic oxide and the nonmetallic compound.

According to the embodiment, a thickness of the etch stopping layer 314 is in a range of 300 Å (ångström)-3000 Å. If the thickness of the etch stopping layer 314 is smaller than 300 Å, the etch stopping layer 314 has a poor protective effect on the first semiconductor layer 313 below, thereby affecting reliability and uniformity of formed transistors. If the thickness of the etch stopping layer is greater than 3000 Å, difficulty of an etching process increases; and insufficient or excessive etching may be caused, thereby affecting device performance.

The drive circuit according to the embodiment may further include a compensation circuit (not shown in FIG. 3), for compensating a drift of a threshold voltage of the driving transistor and compensating a drift of a source voltage. Similarly, a driving transistor in the compensation circuit has an etch stopping layer, and a switching transistor in the compensation circuit does not have an etch stopping layer.

In the drive circuit according to the embodiment, the driving transistor 310 has the etch stopping layer 314, the switching transistor 320 does not have an etch stopping layer; hence, performance of the drive circuit is improved in the following two aspects. In one aspect, the driving transistor 310 has the etch stopping layer 314 which may protect the first semiconductor layer 313, i.e., protect a channel of the transistor; hence, the channel of each driving transistor 310 may not be damaged in forming the transistor, reliability and uniformity of the driving transistors 310 are improved, and due to the improved uniformity of the driving transistors, the Mura phenomenon is avoided from occurring on the corresponding display. In another aspect, the switching transistor 320 does not have an etch stopping layer; therefore, the parasitic capacitance of the switching transistor 320 decreases, thereby reducing loads of peripheral circuits around the switching transistor and saving power consumption; furthermore, since a normal compensation process of the circuit may be interfered due to the parasitic capacitance, an compensation effect of the drive circuit may be improved with the decrease of the parasitic capacitance of the switching transistor 320.

Another drive circuit is provided according to a second embodiment of the disclosure.

Figure 4:
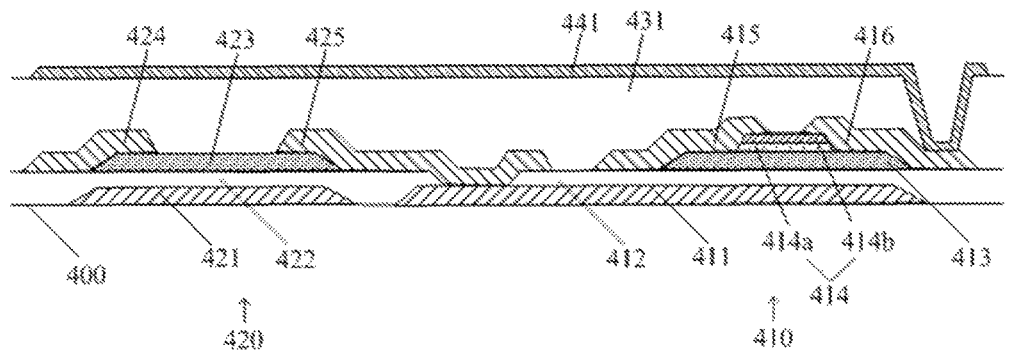

As shown in FIG. 4, the drive circuit includes a driving transistor 410. The driving transistor 410 includes a first gate 411, a first semiconductor layer 413 disposed above the first gate 411, a first dielectric layer 412 disposed between the first semiconductor layer 413 and a first gate 411, an etch stopping layer 414 disposed above the first semiconductor layer 413, and a first source 415 and a first drain 416 which are disposed on two sides of the first semiconductor layer 413.

As shown in FIG. 4, the drive circuit further includes a switching transistor 420. The switching transistor 420 includes a second gate 421, a second semiconductor layer 423 disposed above the second gate 421, a second dielectric layer 422 disposed between the second gate 421 and the second semiconductor layer 423, and a second source 424 and a second drain 425 which are disposed on two sides of the second semiconductor layer 423. The second drain 425 is electrically connected to the first gate 411.

According to the embodiment, the first semiconductor layer 413 and the second semiconductor layer 423 are made of an oxide semiconductor material. The oxide semiconductor material is a compound semiconductor material formed by metal and oxygen, e.g., the oxide semiconductor material may be one or any combination of InGaZnO, InAlZnO, InSnZnO, ZnO, CdO, $TiO_2$, $Al_2O_3$, SnO, $Cu_2O$, NiO, CoO, FeO and $Cr_2O_3$.

According to the embodiment, the first gate 411 and the second gate 421 may be made of metal or alloy, such as aluminum, copper, aluminum-niobium alloy, or molybdenum-tungsten alloy. The first gate 411 and the second gate 421 may be made of a same material; hence, the first gate 411 and the second gate 421 may be formed at a same time through a same process, thereby simplifying processes and saving the cost. In other embodiments of the disclosure, the first gate and the second gate may be made of different materials.

According to the embodiment, the first dielectric layer 412 and the second dielectric layer 422 may be made of silicon oxide, silicon nitride or other material that provides proper insulating characteristics. The first dielectric layer 412 and the second dielectric layer 422 respectively serve as a gate dielectric layer of the driving transistor 410 and a gate dielectric layer of the switching transistor 420.

According to the embodiment, both the driving transistor 410 and the switching transistor 420 are disposed on a substrate. In FIG. 4, although the substrate is not completely shown, a straight line 400 at the bottom represents a surface of the substrate.

According to the embodiment, the second drain 425 of the switching transistor 420 is electrically connected to the first gate 411; hence, the switching transistor 420 is electrically connected to the driving transistor 410.

According to the embodiment, the driving transistor 410 and the switching transistor 420 are both covered by a dielectric layer 431. The dielectric layer 431 includes an opening through which the first drain 416 is exposed, and an electrode layer 441 is electrically connected to the first drain 416 through the opening.

The drive circuit according to the embodiment may further include a compensation circuit (not shown in FIG. 4), for compensating a drift of a threshold voltage of the driving transistor and compensating a drift of a source voltage. Similarly, a driving transistor in the compensation circuit has an etch stopping layer, and a switching transistor in the compensation circuit does not have an etch stopping layer.

According to the embodiment, a thickness of the etch stopping layer 414 is in a range of 300 Å-3000 Å. If the thickness of the etch stopping layer 414 is smaller than 300 Å, the etch stopping layer 414 has a poor protective effect on the first semiconductor layer 413 below, thereby affecting reliability and uniformity of formed transistors. If the thickness of the etch stopping layers is greater than 3000 Å, difficulty of an etching process increases, and insufficient or excessive etching may be caused, thereby affecting device performance.

Different from the foregoing embodiment, according to the embodiment, the etch stopping layer 414 includes a lower layer 414a and an upper layer 414b, where the lower layer 414a is disposed above the first semiconductor layer 413, and the upper layer 414b is disposed above the lower layer 414a.

According to the embodiment, the lower layer 414a is made of a metallic oxide, and the upper layer 414b is made of a nonmetallic compound. The laminated structure has following merits.

Since the first semiconductor layer 413 is made of the oxide semiconductor material which usually is metallic oxide (such as InGaZn, InAlZnO or InSnZnO), the lower layer 414a made of the metallic oxide may protect the first semiconductor layer 413 from negative effects when performing a back channel etching on the first semiconductor layer 413. The first source 415 and the first drain 416 are usually made of metal (such as Cu, Mo, Al, Ti or alloy thereof), and are usually formed by using a wet etching (a metal etching); while etchant used in the wet etching may etch other metallic oxides (including a metallic oxide semiconductor). Hence an etching effect of the wet etching (metal etching) may be blocked by the upper layer 414b made of a nonmetallic oxide (such as SiOx).

According to the embodiment, the lower layer 414a may be made of at least one of alumina oxide, titanium oxide and yttrium oxide. The upper layer 414b may be made of at least one of silicon oxide, silicon nitride and silicon oxynitride.

According to the embodiment, a thickness of the lower layer 414a is in a range of 100 Å-1000 Å. In one aspect, the thickness of the lower layer 414a needs to be greater than 100 Å, to well protect the first semiconductor layer 413 during the back channel etching; in another aspect, the thickness of the lower layer 414a needs to be smaller than 1000 Å, so that the thickness of the whole etch stopping layer 414 may not be too large, thereby preventing increased difficulty of etching, and insufficient or excessive etching.

According to the embodiment, a thickness of the upper layer 414b may be in a range of 100 Å-1000 Å. In one aspect, the thickness of the upper layer 414b needs to be greater than 100 Å, to well protect the first semiconductor layer 413 during the wet etching; in another aspect, the thickness of the upper layer 414b needs to be smaller than 1000 Å, so that the thickness of the whole etch stopping layer 414 may not be too large, thereby preventing increased difficulty of etching, and insufficient or excessive etching.

It should be illustrated that according to other embodiments of the disclosure, besides the lower layer 414a and the upper layer 414b, the etch stopping layer 414 may further include other layer structure such as a structure of one layer, two layers or three layers located between the lower layer 414a and the upper layer 414b, which is not limited in the disclosure.

In the drive circuit according to the embodiment of the disclosure, the driving transistor 410 has the etch stopping layer 414, and the etch stopping layer 414 includes the lower layer 414a and the upper layer 414b. The first semiconductor layer 413 in the driving transistor 410 is better protected, and accordingly, reliability and uniformity of the driving transistors 410 are further improved.

An OLED display is provided according to a third embodiment of the disclosure.

The OLED display includes a substrate and an OLED disposed on the substrate. The OLED display also includes the drive circuits according to the foregoing embodiments; the drive circuits are disposed on the substrate, and specific structures and properties of the drive circuits may be referred to corresponding contents of the foregoing embodiments in conjunction with FIG. 3 or FIG. 4.

Figure 5:
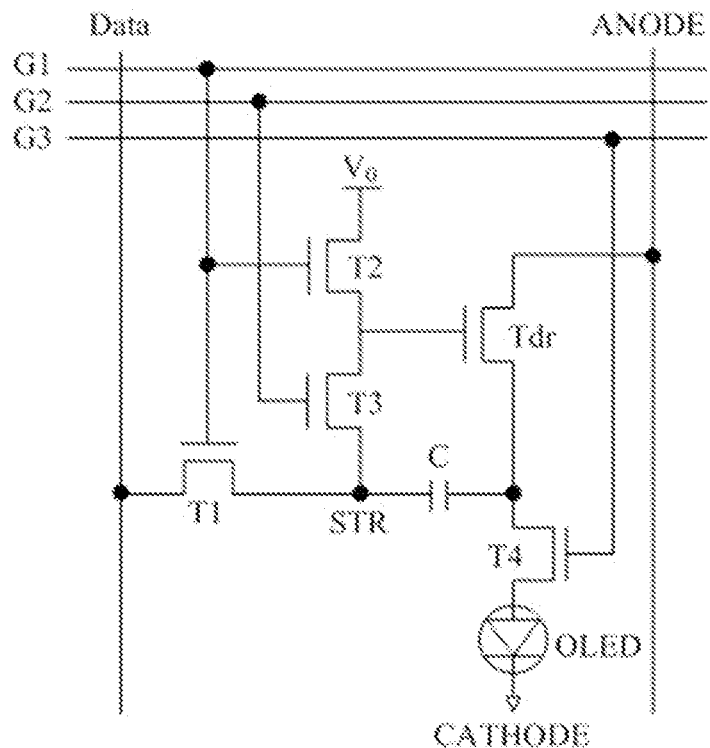
FIG. 5 is a diagram of a drive circuit in an OLED display according to a third embodiment of the disclosure.

FIG. 5 shows a drive circuit for one pixel unit in the OLED display according to the embodiment of the disclosure. The drive circuit includes an anode line ANODE, a cathode CATHODE, a data line Data, a gate line G1, a gate line G2 and a gate line G3, and also includes four switching transistors T1, T2, T3 and T4, and a driving transistor Tdr. Gates of the switching transistor T1 and the switching transistor T2 are electrically connected to the gate line G1, a gate of the switching transistor T3 is electrically connected to the gate line G2, and a gate of the switching transistor T4 is electrically connected to the gate line G3. A source and a drain of the switching transistor T1 are respectively electrically connected to the data line Data and a signal port STR. The switching transistor T2 and the switching transistor T3 are connected in series between a voltage line Vo and the signal port STR. A node between the switching transistor T2 and the switching transistor T3 is connected to a gate of the driving transistor Tdr by a wire. The driving transistor Tdr and the switching transistor T4 are connected in series between the anode line ANODE and an organic light-emitting layer OLED. The organic light-emitting layer OLED is located between the switching transistor T4 and the cathode CATHODE A capacitor C is formed between the signal port STR and a node between the driving transistor Tdr and the switching transistor T4.

A working process of the drive circuit shown in FIG. 5 may include four stages: an initialization stage, a signal inputting stage, a compensation stage and a light-emitting stage.

In the initialization stage, the switching transistor T1, the switching transistor T2 and the switching transistor T3 are turned off and the switching transistor T4 is turn on, to prepare for a signal inputting.

In the signal inputting stage, the switching transistor T1, the switching transistor T2, and the switching transistor T4 are turned on and the switching transistor T3 is turned off; here, a signal (voltage) Vdata from the data line Data is input to the signal port STR, and a signal (voltage) V0 from the voltage line Vo is applied to the gate of the driving transistor Tdr, to prepare for a compensation.

In the compensation stage, the switching transistor T1 and the switching transistor T2 are turned on, and the switching transistor T3 and the switching transistor T4 are turned off. The signal port STR holds the signal Vdata from the data line Data, a voltage at a source of the driving transistor Tdr changes into V0-Vth, thereby achieving compensations for drifts of a threshold voltage and a source voltage of the driving transistor Tdr.

In the light-emitting stage, the switching transistor T1 and the switching transistor T2 are turned off, and the switching transistor T3 and the switching transistor T4 are turned on. Here, a difference Vgs between voltages at the gate and at the source of the driving transistor Tdr equals to Vdata−V0+Vth. An output current Ids of the driving transistor Tdr equals to $K(Vdata-V_0)^2$.

The OLED display according to the embodiment includes the drive circuits according to the foregoing two embodiments of the disclosure; the driving transistor Tdr has an etch stopping layer (reference may be made to the driving transistor 310 shown in FIG. 3 or the driving transistor 410 shown in FIG. 4); and the switching transistor T1, the switching transistor T2, the switching transistor T3 and the switching transistor T4 do not have an etch stopping layer (reference may be made to the switching transistor 320 shown in FIG. 3 or the switching transistor 420 shown in FIG. 4). Therefore, in the whole circuit, parasitic capacitances of the respective switching transistors decrease, thereby reducing loads of peripheral circuits around the switching transistors, saving power consumption, and improving a compensation effect of the drive circuit. For different pixel units, driving transistors for driving respective pixel units all have etch stopping layers; therefore, reliability and uniformity of the driving transistors are improved, and accordingly, a Mura phenomenon is avoided from occurring on the OLED display.

Another OLED display is provided according to a fourth embodiment of the disclosure.

Figure 13:
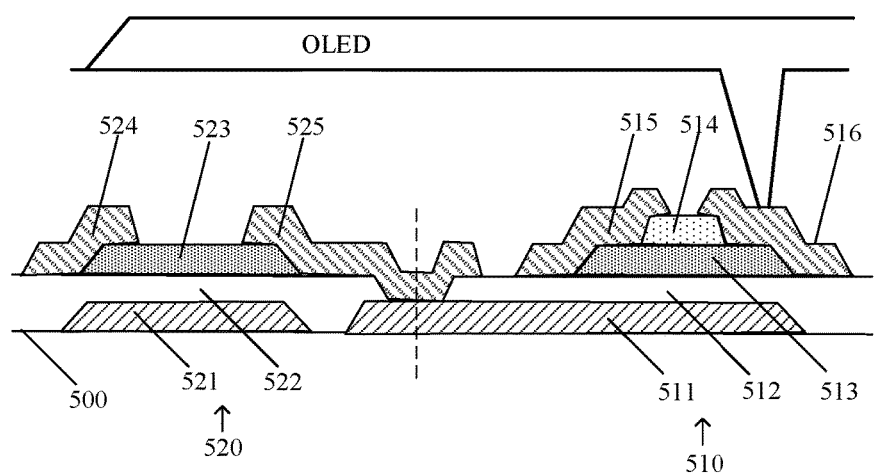
FIG. 13 is a schematic structural diagram of an OLED display according to an embodiment of the present disclosure.

As is shown in FIG. 13, the OLED display includes a substrate and an OLED disposed on the substrate. The OLED display also includes the drive circuits according to the first embodiment or the second embodiment. The drive circuits are disposed on the substrate, and specific structures and property of the drive circuits may be referred to corresponding contents of the first and second embodiments in conjunction with FIG. 3 or FIG. 4.

Figure 6:
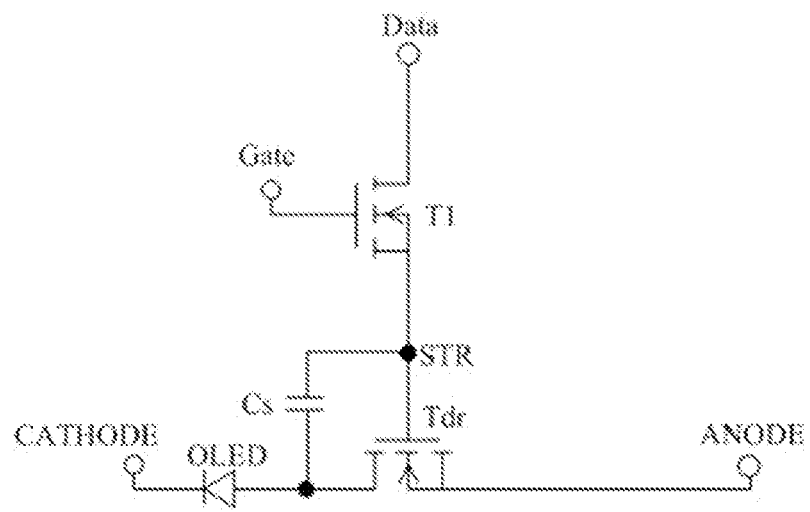
FIG. 6 is a diagram of a drive circuit in an OLED display according to a fourth embodiment of the disclosure.

FIG. 6 shows a drive circuit for one pixel unit in the OLED display according to the embodiment of the disclosure. The drive circuit includes an anode ANODE, a cathode CATHODE, a data line Data, a gate line Gate, and also includes a switching transistor T1 and a driving transistor Tdr. A gate of the switching transistor T1 is connected to the gate line Gate. A source and a drain of the switching transistor T1 are respectively electrically connected to the data line Data and a gate of the driving transistor Tdr. A signal port STR is located between the gate of the driving transistor Tdr and the switching transistor T1. A source and a drain of the driving transistor Tdr are respectively connected to the anode ANODE and an organic light-emitting layer OLED. The organic light-emitting layer OLED is located between the driving transistor Tdr and the cathode CATHODE, and a storage capacitor Cs is formed between the signal port STR and a node between the driving transistor Tdr and the organic light-emitting layer OLED.

A working process of the drive circuit shown in FIG. 6 is described as follows. A level signal is transmitted from the gate line Gate, to turn the switching transistor T1 on; a data signal from the data line Data is applied to the signal port STR and the storage capacitor Cs is charged. Here the driving transistor Tdr is turned on, a current flows from the anode ANODE to the cathode CATHODE, thereby driving the organic light-emitting layer OLED located between the anode ANODE and the cathode CATHODE to emit light.

The OLED display according to the embodiment includes the drive circuits according to the first embodiment or the second embodiment; the driving transistor Tdr has an etch stopping layer (reference may be made to the driving transistor 310 shown in FIG. 3 or the driving transistor 410 shown in FIG. 4); and the switching transistor T1 do not have an etch stopping layer (reference may be made to the switching transistor 320 shown in FIG. 3 or the switching transistor 420 shown in FIG. 4). Therefore, in the whole circuit, parasitic capacitances of the respective switching transistors decrease, thereby reducing loads of peripheral circuits around the switching transistors, saving power consumption, and improving a compensation effect of the drive circuit. For different pixel units, driving transistors for driving respective pixel units all have etch stopping layers; therefore, reliability and uniformity of the driving transistors are improved, and accordingly, a Mura phenomenon is avoided from occurring on the OLED display.

A method for fabricating a drive circuit is further provided according to a fifth embodiment of the disclosure, which may be referred to FIGS. 7-12.

Figure 7:
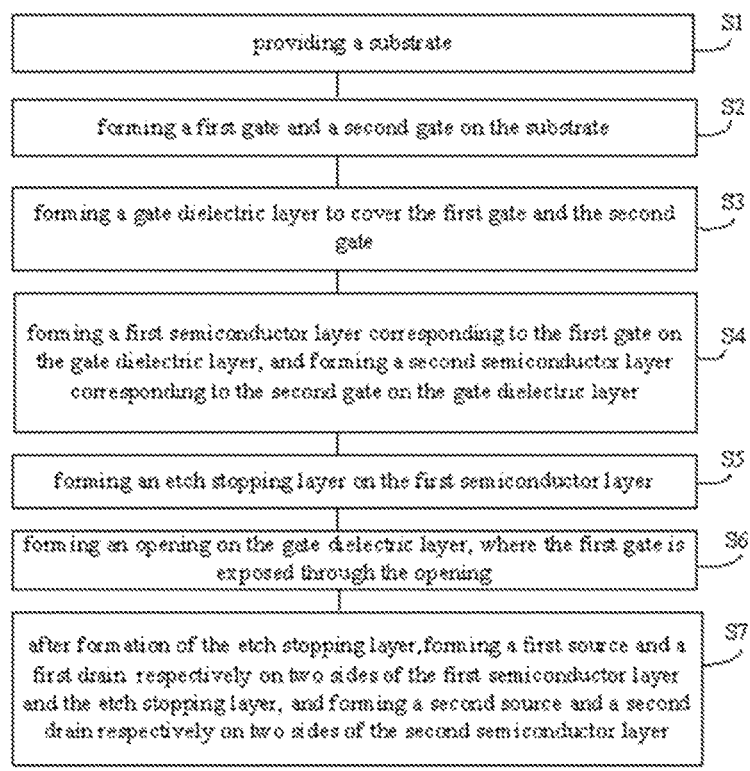
FIG. 7 is a schematic flow chart of a method for fabricating a drive circuit according to a fifth embodiment of the disclosure.

FIG. 7 is a schematic flow chart of the method for fabricating the drive circuit.

Figure 8:
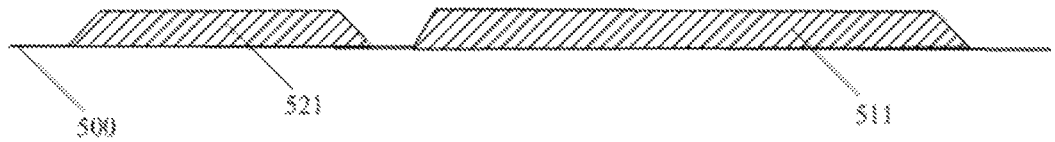
FIG. 8 is a schematic structural diagram corresponding to respective steps of the method for fabricating the drive circuit according to the fifth embodiment of the disclosure.

As shown in FIG. 7 and FIG. 8, a step S1 is performed to provide a substrate 500.

According to the embodiment, the substrate 500 may be made of glass, plastic (such as PET), or other material with proper insulation properties.

As shown in FIG. 7 and FIG. 8, a step 2 is performed to form a first gate 511 and a second gate 521 on the substrate 500.

According to the embodiment, the first gate 511 and the second gate 521 may be made of one of Cu, Mo, Al and Ti or an alloy thereof. The first gate 511 and the second gate 521 may each have a single-layer (metallic) structure or a multi-layer (metallic) structure. A thickness of the first gate 511 and the second gate 521 may be in a range of 1000 Å-4000 Å.

According to the embodiment, a gate material layer may be formed by using a sputtering method (physical vapor deposition); a mask layer (such as a photoresist layer) may be formed on the gate material layer; the mask layer is exposed by using a first photomask and is developed by using a developer, thereby forming a patterned mask layer; then the patterned mask is used as a mask, and the gate material layer is patterned through etching, to form the first gate 511 and the second gate 521.

Figure 9:
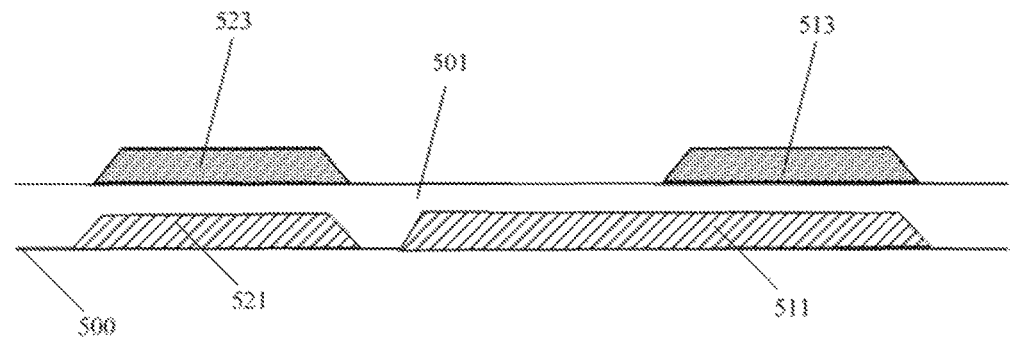
FIG. 9 is a schematic structural diagram corresponding to respective steps of the method for fabricating the drive circuit according to the fifth embodiment of the disclosure.

As shown in FIG. 7 and FIG. 9, a step S3 is performed to form a gate dielectric layer 501 to cover the first gate 511 and the second gate 521.

According to the embodiment, the gate dielectric layer 501 may be made of silicon oxide or silicon nitride, and the gate dielectric layer 501 may be formed by using a chemical vapor deposition. Different portions of the gate dielectric layer 501 may serve as gate dielectric layers for different transistors which are subsequently formed.

As shown in FIG. 7 and FIG. 9, a step S4 is performed to form a first semiconductor layer 513 and a second semiconductor layer 523 above the gate dielectric layer 501, where the first semiconductor layer 513 corresponds to the first gate 511, and the second semiconductor layer 523 corresponds to the second gate 521.

According to the embodiment, the first semiconductor layer 513 and the second semiconductor layer 523 are made of an oxide semiconductor material. The oxide semiconductor material may be InGaZnO, InAlZnO or InSnZnO, etc. According to the embodiment, a thickness of the first semiconductor layer 513 and the second semiconductor layer 523 may be in a range of 100 Å-1500 Å.

According to the embodiment, a process of forming the first semiconductor layer 513 and the second semiconductor layer 523 may include: forming a semiconductor material layer; forming a patterned mask layer (such as a photoresist layer) on the semiconductor material layer by using a second photomask; and etching, by using the patterned mask layer as a mask, the semiconductor material layer to form the first semiconductor layer 513 and the second semiconductor layer 523 with remaining semiconductor material layer.

Figure 10:
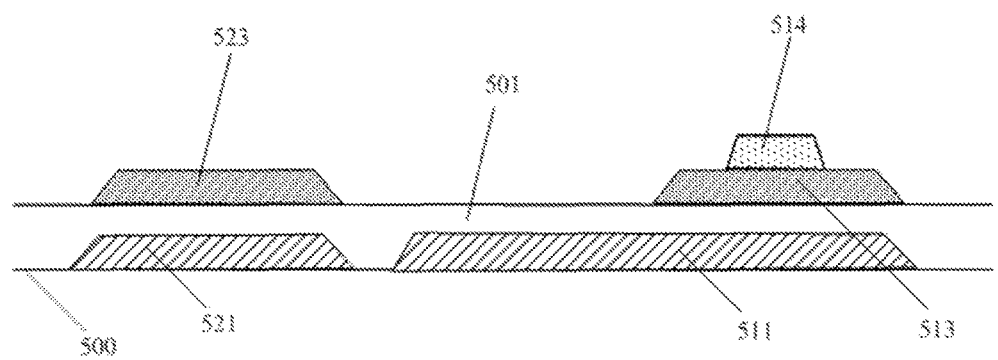
FIG. 10 is a schematic structural diagram corresponding to respective steps of the method for fabricating the drive circuit according to the fifth embodiment of the disclosure.

As shown in FIG. 7 and FIG. 10, a step S5 is performed to form an etch stopping layer 514 above the first semiconductor layer 513.

According to the embodiment, the etch stopping layer 514 may be made of a metallic which may include at least one of alumina oxide, titanium oxide, and yttrium oxide, or the etch stopping layer 514 may be made of a nonmetallic compound which may include at least one of silicon oxide, silicon nitride and silicon oxynitride. Or the etch stopping layer 514 may be made of a combination of the metallic oxide and the nonmetallic compound. A thickness of the etch stopping layer 514 may be in a range of 300 Å-3000 Å.

According to the embodiment, a process of forming the etch stopping layer 514 may include: forming an etch stopping material layer; forming a patterned mask layer (such as a photoresist layer) on the etch stopping material layer by using a third photomask; and etching, by using the patterned mask layer as a mask, the etch stopping material layer to form the etch stopping layer 514 with remaining etch stopping material layer.

It should be illustrated that, according to other embodiments of the disclosure, the etch stopping layer may have a multilayer structure having two layers, three layers, or four or more layers. For example, the etch stopping layer may have a two-layer structure (including a lower layer and an upper layer) shown in FIG. 4. In a case that the etch stopping layer has the lower layer and the upper layer, the lower layer is made of the metallic oxide, and the metallic oxide may include at least one of alumina oxide, titanium oxide and yttrium oxide; the upper layer is made of the nonmetallic compound, and the nonmetallic compound may include at least one of silicon oxide, silicon nitride and silicon oxynitride. Here a process of forming the etch stopping layer at least includes: forming the lower layer above the first semiconductor layer with the metallic oxide, and forming the upper layer above the lower layer with the nonmetallic compound. Specifically, during a formation of the etch stopping layer, first the lower layer is formed and then the upper layer is formed; alternatively, a laminated structure of a lower material layer and an upper material layer is formed first, and then the laminated structure is etched to form the lower and upper layers with remaining lower material layer and upper material layer.

Figure 11:
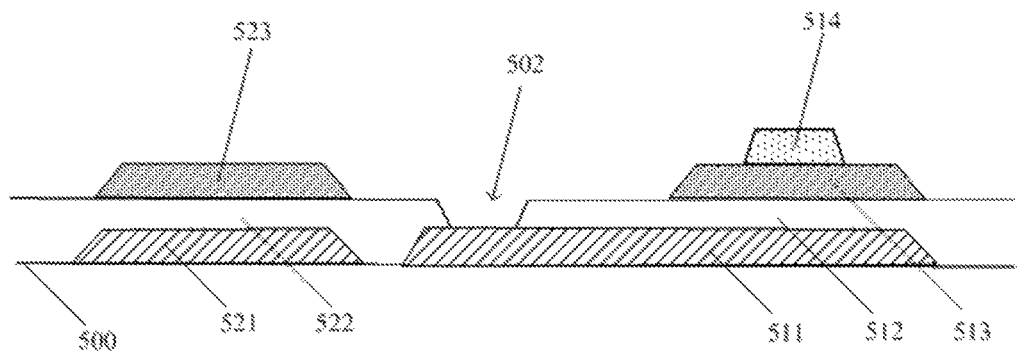
FIG. 11 is a schematic structural diagram corresponding to respective steps of the method for fabricating the drive circuit according to the fifth embodiment of the disclosure.

As shown in FIG. 7 and FIG. 11, a step S6 is performed to form an opening 502 on the gate dielectric layer 501, where the first gate 511 is exposed through the opening. After the formation of the opening 502, the gate dielectric layer 501 as shown in FIG. 10 is divided into two parts, i.e., a first gate dielectric layer 512 and a second gate dielectric layer 522 as shown in FIG. 11.

According to the embodiment, the opening 502 may be formed with a fourth photo mask by using a dry etching. Specific process is well known by persons of ordinary skill in the art, and is not described here.

Figure 12:
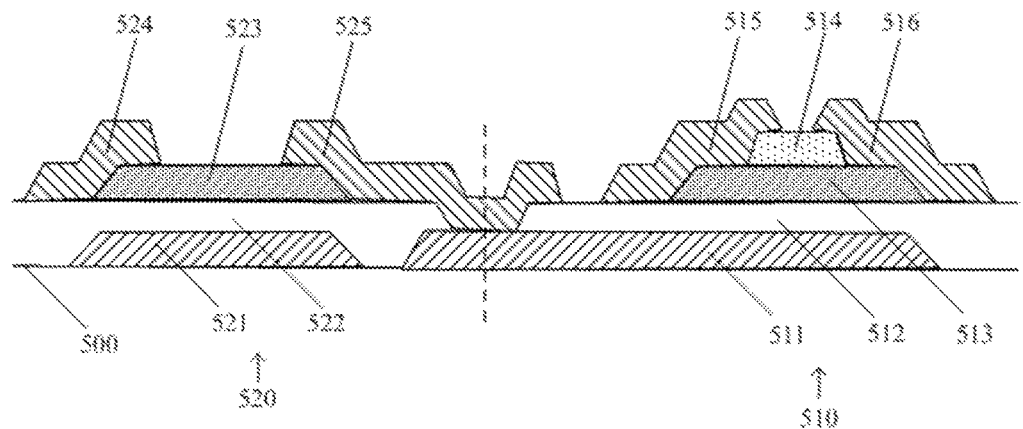
FIG. 12 is a schematic structural diagram corresponding to respective steps of the method for fabricating the drive circuit according to the fifth embodiment of the disclosure.

As shown in FIG. 7 and FIG. 12, after the etch stopping layer 514 is formed, a step S7 is performed, to respectively form a first source 515 and a first drain 516 on two sides of the first semiconductor layer 513 and the etch stopping layer 514 to form a driving transistor; and to respectively form a second source 524 and a second drain 525 on two sides of the second semiconductor layer 523 to form a switching transistor 520. A dielectric layer, which is not shown in FIG. 12, may be subsequently formed to cover the driving transistor 510 and the switching transistor 520.

According to the embodiment, the first source 515, the first drain 516, the second source 524 and the second drain 525 may be made of one of Cu, Mo, Al and Ti or an alloy thereof, and the first source 515, the first drain 516, the second source 524 and the second drain 525 may be formed at a same time by using a fifth photomask.

According to the embodiment, usually, patterns for respective sources and drains may be formed through the wet etching, and back channels may be etched through the dry etching. Since the etch stopping layer is disposed above the first semiconductor layer, the first semiconductor layer may not suffer damage during etching. Therefore, reliability and uniformity of subsequently formed driving transistors are improved.

It is should be illustrated that, according to other embodiments of the disclosure, in a case that the etch stopping layer has a multi-layer structure (such as the lower layer and the upper layer as shown in FIG. 4), the first semiconductor layer may be better protected, and reliability and uniformity of finally formed driving transistors are further improved.

In the method for fabricating the drive circuit according to the embodiment, the etch stopping layer 514 is merely formed in the driving transistor 510, and the switching transistor 520 do not have an etch stopping layer. Therefore, parasitic capacitance of the switching transistor 520 is small, thereby reducing loads of peripheral circuits around the switching transistor 520. During formation of the driving transistor, the etch stopping layer 514 may protect the first semiconductor layer 513 well; hence, a channel formed in the first semiconductor layer 513 is prevented forming being damaged, thereby improving reliability and uniformity of the driving transistors 510.

According to a sixth embodiment, a method for fabricating an OLED display is provided.

In the method for fabricating the OLED display, the method for fabricating the drive circuit according to the previous embodiment is used to form a drive circuit in the OLED display; and specific process may be referred to corresponding contents of the previous embodiment in conjunction with FIGS. 7 to 12.

In the method for fabricating the OLED display according to the embodiment, since the drive circuit is formed by using the method according to the previous embodiment, in the formed OLED display, parasitic capacitance of a switching transistor in the drive circuit is small, and reliability and uniformity of driving transistors in the drive circuit are high; therefore, performance of a finally formed OLED display is improved.

Although preferred embodiments are disclosed hereinabove, the disclosure is not limited to the disclosed embodiments. Various alternations and modifications may be made by any of those skilled in the art within the spirit and scope of the disclosure; therefore the protection scope of the disclosure is in accordance with the scope limited by claims.

That which is claimed:

1. A drive circuit for an OLED display panel, comprising:
   a driving transistor, comprising:
      a first gate;
      a first dielectric layer disposed on the first gate;
      a first semiconductor layer disposed on the first dielectric layer and patterned into a channel structure above the first gate;
      an etch stopping layer disposed on the first semiconductor layer, wherein the etch stopping layer comprises a lower layer and an upper layer directly on top of the lower layer, wherein the lower layer is made of a metallic oxide, and wherein the upper layer is made of a nonmetallic compound; and
      a first source and a first drain disposed on two sides of the first semiconductor layer and the etch stopping layer, wherein the first source and the first drain leave a first area exposed on the upper surface, the first source is composed of a first section, a second section, a third section, a fourth section and a fifth section, the first section is disposed on an upper surface of the upper layer, the second section is disposed on a side surface of the etch stopping layer, the third section is disposed on an upper surface of the first semiconductor layer, the fourth section is disposed on a side surface of the first semiconductor layer, and the fifth section is disposed on an upper surface of the first dielectric layer;

a switching transistor, comprising:
  a second gate;
  a second dielectric layer disposed on the second gate;
  a second semiconductor layer disposed on the second dielectric layer and patterned into a channel structure above the second gate; and
  a second source and a second drain disposed on two sides of the second semiconductor layer, wherein the second source and the second drain leave a second area exposed on the second semiconductor layer, the second source is composed of a sixth section, a seventh section and an eighth section, the sixth section is disposed on an upper surface of the second semiconductor layer, the seventh section is disposed on a side surface of the second semiconductor layer, and the eighth section is disposed on an upper surface of the second dielectric layer;

and a third dielectric layer disposed on top of the driving transistor and the switching transistor, wherein the third dielectric layer is disposed to cover the full first area and the full second area in contact with the etch stopping layer in the driving transistor and the second semiconductor layer in the switching transistor;

wherein the first semiconductor layer and the second semiconductor layer are made of an oxide semiconductor material.

2. The drive circuit according to claim 1, wherein the metallic oxide comprises one of alumina, titanium oxide and yttrium oxide.

3. The drive circuit according to claim 1, wherein the nonmetallic compound comprises at least one of silicon oxide, silicon nitride and silicon oxynitride.

4. The drive circuit according to claim 1, wherein a thickness of the etch stopping layer in the driving transistor is in a range of 300 Å-3000 Å.

5. The drive circuit according to claim 1, wherein a thickness of the lower layer of the etch stopping layer in the driving transistor is in a range of 100 Å-1000 Å, and a thickness of the upper layer is in a range of 100 Å-1000 Å.

6. An organic light-emitting diode display, comprising:
a substrate;
a drive circuit disposed on the substrate, wherein the drive circuit comprises a driving transistor, a switching transistor and
an organic light-emitting diode disposed on the substrate;

wherein the driving transistor comprises:
  a first gate;
  a first dielectric layer disposed on the first gate;
  a first semiconductor layer disposed on the first dielectric layer and patterned into a channel structure above the first gate;
  an etch stopping layer disposed on the first semiconductor layer, wherein the etch stopping layer comprises a lower layer and an upper layer directly on top of the lower layer, wherein the lower layer is made of a metallic oxide, and wherein the upper layer is made of a nonmetallic compound; and
  a first source and a first drain disposed on two sides of the first semiconductor layer and the etch stopping layer, wherein the first source and the first drain leave a first area exposed on the upper surface, the first source is composed of a first section, a second section, a third section, a fourth section and a fifth section, the first section is disposed on an upper surface of the upper layer, the second section is disposed on a side surface of the etch stopping layer, the third section is disposed on an upper surface of the first semiconductor layer, the fourth section is disposed on a side surface of the first semiconductor layer, and the fifth section is disposed on an upper surface of the first dielectric layer;

wherein the switching transistor comprises:
  a second gate;
  a second dielectric layer disposed on the second gate;
  a second semiconductor layer disposed on the second dielectric layer and patterned into a channel structure above the second gate; and
  a second source and a second drain disposed on two sides of the second semiconductor layer, wherein the second source and the second drain leave a second area exposed on the second semiconductor layer, the second source is composed of a sixth section, a seventh section and an eighth section, the sixth section is disposed on an upper surface of the second semiconductor layer, the seventh section is disposed on a side surface of the second semiconductor layer, and the eighth section is disposed on an upper surface of the second dielectric layer;

a third dielectric layer is disposed on the driving transistor and the switching transistor covering at least the full first area and the full second area; and wherein the first semiconductor layer and the second semiconductor layer are made of an oxide semiconductor material.

\* \* \* \* \*